(12) United States Patent
Scott et al.

(10) Patent No.: US 12,483,204 B2
(45) Date of Patent: Nov. 25, 2025

(54) POWER AMPLIFIER SYSTEM

(71) Applicant: Qorvo US, Inc., Greensboro, NC (US)

(72) Inventors: Baker Scott, San Jose, CA (US);
George Maxim, Saratoga, CA (US);
Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 803 days.

(21) Appl. No.: 17/706,985

(22) Filed: Mar. 29, 2022

(65) Prior Publication Data

US 2023/0318537 A1    Oct. 5, 2023

(51) Int. Cl.
| | |
|---|---|
| *H03F 3/68* | (2006.01) |
| *H03F 1/02* | (2006.01) |
| *H03F 1/22* | (2006.01) |
| *H03F 1/32* | (2006.01) |
| *H03F 3/24* | (2006.01) |
| *H03F 3/21* | (2006.01) |

(52) U.S. Cl.
CPC ......... *H03F 1/3282* (2013.01); *H03F 1/0222* (2013.01); *H03F 3/245* (2013.01); *H03F 1/223* (2013.01); *H03F 3/211* (2013.01); *H03F 2200/451* (2013.01)

(58) Field of Classification Search
CPC ...... H03F 1/3282; H03F 1/0222; H03F 3/245; H03F 2200/451; H03F 2200/42; H03F 2200/432; H03F 1/3205; H03F 1/3217; H03F 1/3223; H03F 1/3252; H03F 1/3276; H03F 3/211; H03F 3/3028; H03F 3/193; H03F 3/68; H03F 3/602; H03F 3/195; H03F 1/0288

USPC .............................................. 330/124 R, 295
See application file for complete search history.

(56) References Cited

U.S. PATENT DOCUMENTS

| | | | |
|---|---|---|---|
| 6,292,060 B1 | 9/2001 | Yeo et al. | |
| 6,803,824 B2 | 10/2004 | Rategh et al. | |
| 6,850,120 B2 | 2/2005 | Heima et al. | |
| 7,276,976 B2 | 10/2007 | Oh et al. | |
| 7,295,064 B2 * | 11/2007 | Shiikuma .............. | H03F 1/3276 330/136 |
| 7,741,910 B2 | 6/2010 | Wong | |
| 7,821,349 B2 | 10/2010 | Park et al. | |
| 8,111,104 B2 | 2/2012 | Ahadian et al. | |

(Continued)

FOREIGN PATENT DOCUMENTS

EP    2618481 A1    7/2013

OTHER PUBLICATIONS

Fu, J. et al., "A 2.4G-Hz CMOS Power Amplifier," 2010 10th IEEE International Conference on Solid-State and Integrated Circuit Technology, Nov. 1-4, 2010, Shanghai, China, IEEE, 3 pages.

(Continued)

*Primary Examiner* — Khanh V Nguyen
(74) *Attorney, Agent, or Firm* — Withrow & Terranova, P.L.L.C.

(57) ABSTRACT

Disclosed is a power amplifier system having a main amplifier with an input coupled to a main radio frequency (RF) input and an output connected to a main RF output, wherein the main amplifier exhibits a nonlinear gain characteristic with compression. At least one compression compensating amplifier has a signal input coupled to the common RF input and a signal output coupled to the common RF output.

17 Claims, 7 Drawing Sheets

(56) References Cited

U.S. PATENT DOCUMENTS

| | | | |
|---|---|---|---|
| 8,120,428 | B2 | 2/2012 | Montalvo et al. |
| 8,493,154 | B1 | 7/2013 | Camargo et al. |
| 8,648,656 | B2 | 2/2014 | Nozaki et al. |
| 8,686,796 | B2 | 4/2014 | Presti |
| 8,779,860 | B2 | 7/2014 | Jeon et al. |
| 8,847,689 | B2 | 9/2014 | Zhao et al. |
| 9,362,872 | B2 * | 6/2016 | Park .................. H03F 1/083 |
| 9,413,309 | B1 | 8/2016 | Zhao et al. |
| 9,621,110 | B1 | 4/2017 | Boyavalle et al. |
| 10,020,780 | B2 | 7/2018 | Shimura |
| 11,711,057 | B2 * | 7/2023 | Lehtola .............. H03F 3/193 |
| | | | 330/124 R |
| 2003/0193371 | A1 | 10/2003 | Larson et al. |
| 2011/0037519 | A1 | 2/2011 | Pletcher et al. |
| 2011/0304395 | A1 * | 12/2011 | Koo .................... H03F 1/223 |
| | | | 330/296 |
| 2012/0146722 | A1 | 6/2012 | Scott et al. |
| 2013/0154744 | A1 * | 6/2013 | Samavedam ........ H03G 3/00 |
| | | | 330/278 |
| 2013/0176077 | A1 | 7/2013 | Pai et al. |
| 2016/0173036 | A1 | 6/2016 | Vogt et al. |
| 2017/0207758 | A1 | 7/2017 | Tseng et al. |
| 2020/0007088 | A1 | 1/2020 | Ranta et al. |
| 2022/0078051 | A1 | 3/2022 | Siddamurthy et al. |
| 2023/0163734 | A1 | 5/2023 | Scott et al. |
| 2023/0336127 | A1 | 10/2023 | Scott et al. |
| 2023/0336128 | A1 | 10/2023 | Scott et al. |

OTHER PUBLICATIONS

Extended European Search Report for European Patent Application No. 23161975.0, mailed Aug. 31, 2023, 15 pages.

Sowlati, T. et al., "A 2.4-GHz 0.18-μm CMOS Self-Biased Cascode Power Amplifier," IEEE Journal of Solid-State Circuits, vol. 38, No. 8, Aug. 2003, IEEE, pp. 1318-1324.

Non-Final Office Action for U.S. Appl. No. 17/659,221, mailed Oct. 30, 2024, 8 pages.

Extended European Search Report for European Patent Application No. 23165650.5, mailed Sep. 7, 2023, 12 pages.

* cited by examiner

POWER AMPLIFIER SYSTEM

FIELD OF THE DISCLOSURE

The present disclosure relates to radio frequency amplification systems and methods of operating the same.

BACKGROUND

Traditional power amplifiers typically employ either n-type field-effect transistors (NFETS) or n-type-p-type-n-type (NPN) bipolar transistors in an output stage. This is due to a larger transition frequency and/or larger transconductance of the N-type devices such as NFETS and NPN bipolar transistors. In other words, electrons within N-type devices typically have higher mobility, which makes employing N-type devices as output stage power amplification devices desirable. However, an inductor employed as a choke coil within a power supply path that supplies the last stage with power causes voltage and current ringing that often becomes problematic, particularly with metal oxide semiconductor (MOS)-based implementations.

When the last stage power amplification devices turn OFF, that is, stop conducting, the level to which the output voltage of the last stage reaches can be several times larger than the supply voltage powering the output stage. For example, while a typical supply voltage may be 4.5 V, the output voltage can easily reach 16 V or more, over the load voltage standing wave ratio (VSWR) variation that can bring extreme changes in the complex load impedance. High impedance levels result in large output voltage swings. To counter the excessive voltage at the output of the power amplification stage, an undesirably large number of output stage devices must be stacked. This undesirable number of output stage devices results in a large area for the output stage, high individual parasitic capacitance, and a loss of efficiency due to multiple capacitive paths where the signal gets lost to ground. What is needed is a new output amplifier stage structure that reduces the number of stacked devices in the power amplification stage needed to counter the excessive voltage within at the output node.

SUMMARY

Disclosed is a power amplifier system having a main amplifier with an input coupled to a main radio frequency (RF) input and an output connected to a main RF output, wherein the main amplifier exhibits a nonlinear gain characteristic with compression. At least one compression compensating (CC) amplifier has a signal input coupled to the common RF input and a signal output coupled to the common RF output.

In some embodiments the main amplifier includes a series stack of p-type transistors having a first RF input and a series stack of n-type transistors having a second RF input. The first RF input and the second RF input are coupled to a common RF input that is the main input and the series stack of p-type transistors, and the series stack of n-type transistors are coupled together at a common RF output that is the main output. The compression compensating amplifier has a signal input coupled to the common RF input and a signal output coupled to the common RF output. In at least some embodiments, amplitude modulation-amplitude modulation (AM-AM) compensators are included to improve to AM-AM linearity required for fifth generation (5G) applications. In at least some embodiments, additional amplitude modulation-phase modulation (AM-PM) compensators are included to improve to AM-PM linearity required for fifth generation (5G) applications.

In yet another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1A:
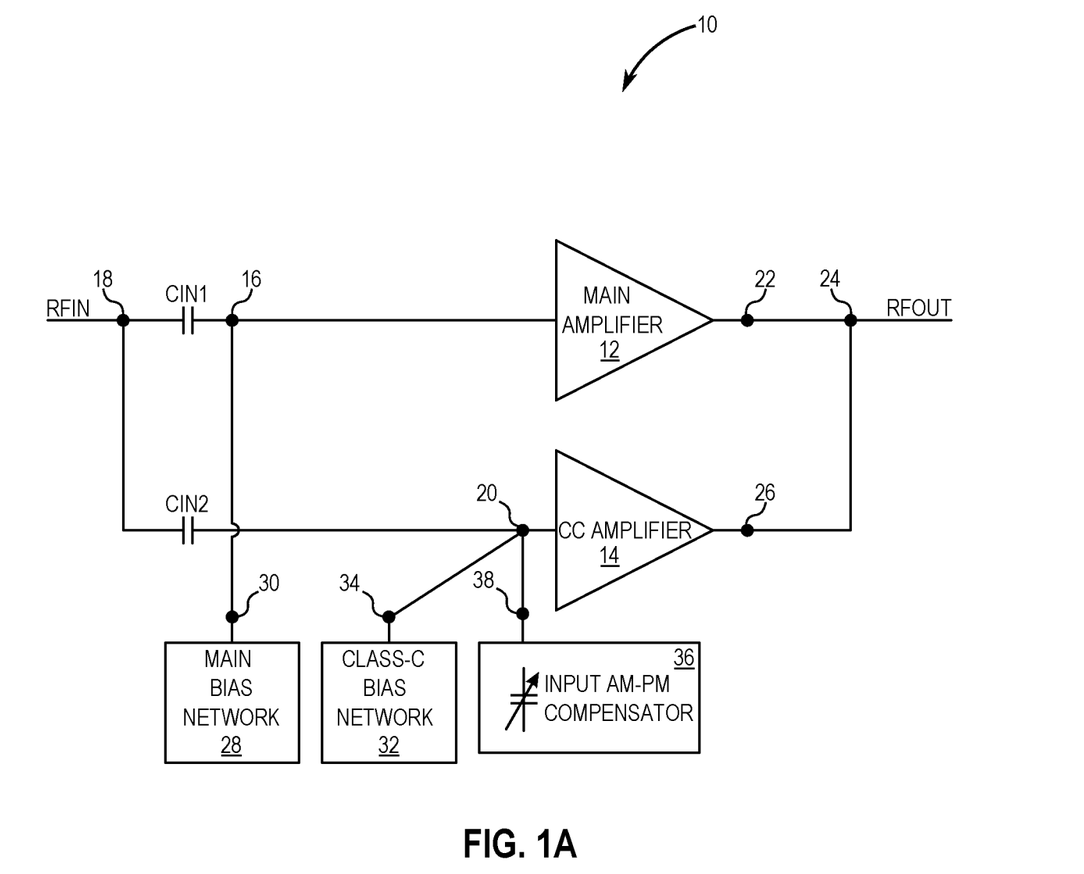
FIG. 1A is a generalized schematic of an exemplary embodiment of a power amplifier system that is structured in accordance with the present disclosure.

FIG. 1A is a generalized schematic of an exemplary embodiment of a power amplifier system 10 that is structured in accordance with the present disclosure. The power amplifier system 10 includes a main amplifier 12 and a compression compensating (CC) amplifier 14. Both the main amplifier 12 and the CC amplifier 14 are supplied by a voltage source VDD. A main signal input 16 is coupled to a common RF input 18 through a first input capacitor CIN1. A CC input 20 is coupled to the common RF input 18 through a second input capacitor CIN2. A main signal output 22 is coupled to a common RF output 24, and a CC signal output 26 is also coupled to the common RF output 24, thereby placing the CC amplifier 14 in parallel with the main amplifier 12. A load such as an antenna is coupled to the common RF output 24. Bias for the main amplifier 12 is generated by a main bias network 28, which in this exemplary embodiment has a main bias output 30 coupled to the main signal input 16. Bias for the CC amplifier 14 is generated by a class-C bias network 32, which has a class-C bias output 34 coupled to the CC input 20. An input amplitude modulation-phase modulation (AM-PM) compensator 36 has a compensation output 38 coupled to the CC input 20. The input AM-PM compensator 36 is configured to counter input capacitance variation of the CC amplifier 14 as its input capacitance increases as the CC amplifier 14 becomes active as signal level of an RF signal being amplified increases.

During operation of the amplifier system 10, any soft amplitude modulation-amplitude modulation (AM-AM) distortion created by the main amplifier 12 at millimeter wave frequencies is compensated by the CC amplifier 14 that is biased as a class-C parallel amplifier stage. At small signal to medium signal levels, the CC amplifier 14 usually has a linear gain characteristic and no AM-AM correction is needed. At some given higher signal level the gain of the CC amplifier 14 may exhibit distortion, for example, soft compression. This is where the CC amplifier 14 begins gradually providing additional amplification as an RF signal being amplified grows in signal level and as soft compression begins. In essence, the bias provided by the class-C bias network 32 generates an offset bias that aligns the activation of the class-C parallel amplifier with the inflection point of the distortion (e.g., soft compression) in the main amplifier 12. The additional gain provided by the class-C biased CC amplifier 14 (gain boosting) needs to inversely match a soft compression profile of the main amplifier 12. Regarding operation of the input AM-PM compensator 36 providing compensation for the input capacitance of the CC amplifier 14, the input capacitance is relatively low when the CC amplifier 14 is turned-off up to the point that the CC amplifier 14 begins compensating for the soft compression. However, as the CC amplifier 14 becomes increasingly active, the input capacitance of the CC amplifier 14 also increases. To compensate, the input AM-PM compensator 36 has a capacitance that is higher before the beginning of soft compression and a capacitance that lowers as RF signal level increases and the CC amplifier becomes active. As such, input capacitance is maintained relatively constant as soft compression is compensated for by the CC amplifier 12.

Figure 1B:
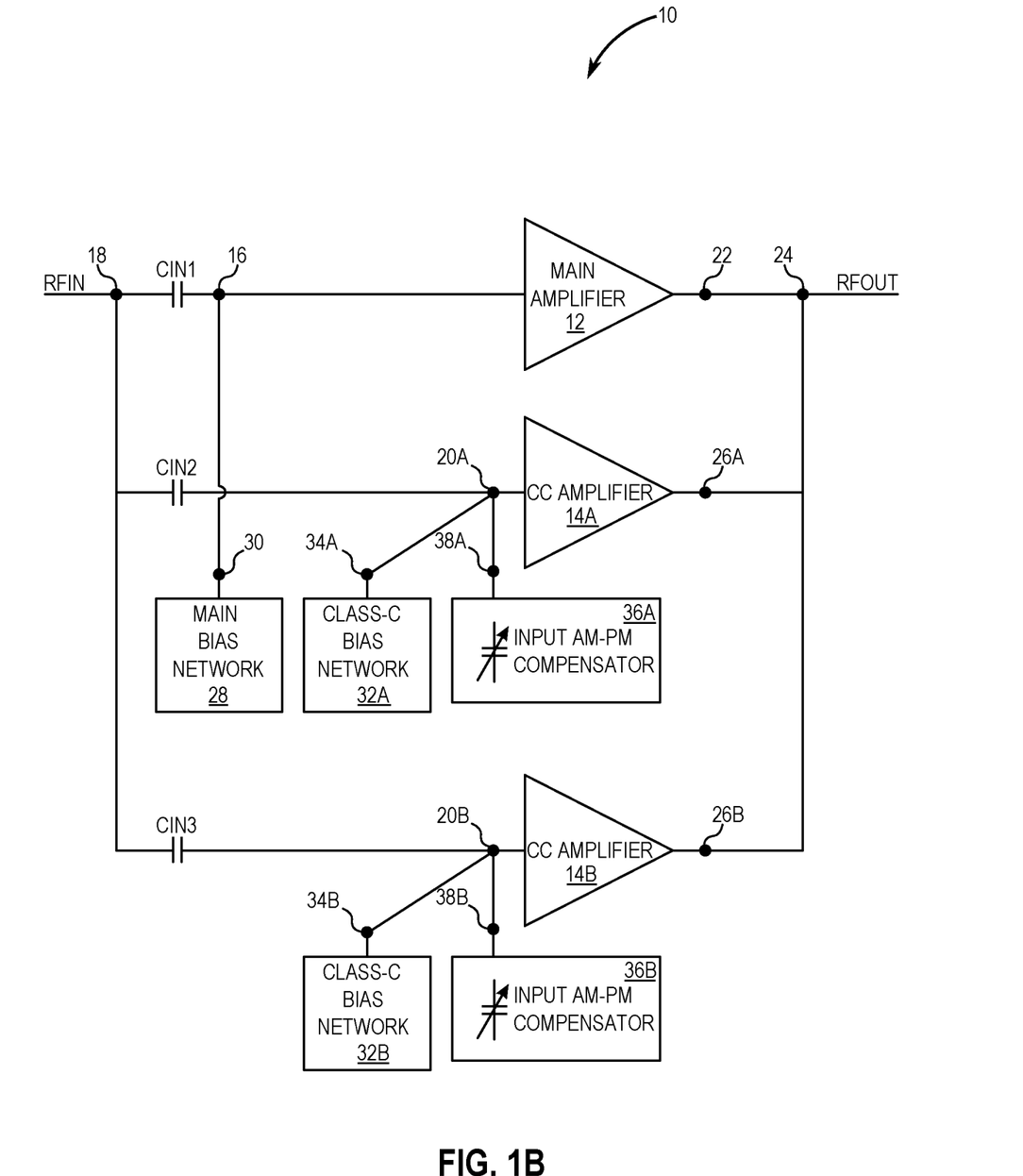
FIG. 1B is an alternate generalized schematic of an exemplary embodiment of a power amplifier system that uses multiple amplitude modulation-amplitude modulation (AM-AM) correction circuits in parallel to realize a multi-segment linearization.

FIG. 1B is another generalized schematic of an exemplary embodiment of a power amplifier system 10 that is structured in accordance with the present disclosure. The main difference from FIG. 1A is that instead of having the one CC amplifier 14 to compensate the distortion of the main amplifier 12, two (or more) CC amplifiers 14A and 14B are used in parallel, each of the CC amplifier 14 A and 14B having a specific offset bias for its activation point. A CC input 20B is coupled to the common RF input 18 through a third input capacitor CIN3. Such implementation becomes useful when the AM-AM characteristic of the main amplifier 12 exhibits distortion regions with different slopes. For example, a soft compression is present at moderate to high signal levels, while a more pronounced compression may be present at higher signal levels, before the amplifier enters hard compression or clipping. In such case, the first CC amplifier 14A compensates for the soft compression and needs to have the offset bias aligned with the soft compression threshold, while the second CC amplifier 14B compensates for the more pronounced compression and needs to have a different offset bias aligned with the moderate compression threshold.

Figure 2A:
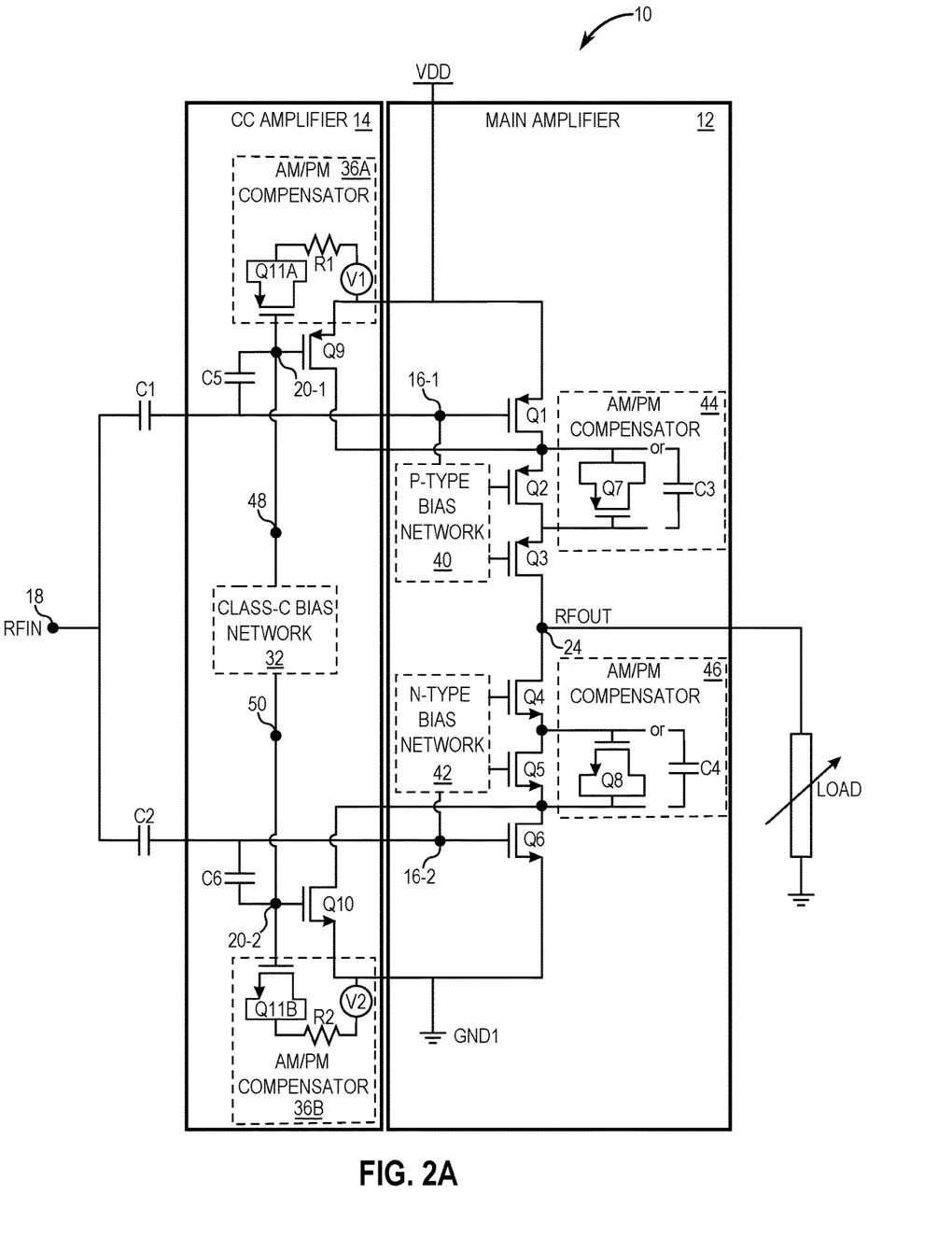
FIG. 2A is a detailed schematic of an exemplary embodiment of a complementary (n-type and p-type) power amplifier system that is structured in accordance with the present disclosure.

FIG. 2A is a detailed schematic of an exemplary embodiment of the power amplifier system 10 that is structured in accordance with the present disclosure. The main amplifier 12 includes a series stack of p-type transistors Q1, Q2, and Q3 coupled to a first RF input 16-1 and a series stack of n-type transistors Q4, Q5, and Q6 coupled to a second RF input 16-2. The first RF input 16-1 and the second RF input 16-2 are coupled to the common RF input 18 through a first coupling capacitor C1 and a second coupling capacitor C2, respectively. The series stack of p-type transistors Q1, Q2, and Q3, and the series stack of n-type transistors Q4, Q5, and Q6 are coupled together at the common RF output 24. A p-type bias network 40 is configured to generate bias for the p-type transistors Q1, Q2, and Q3. In some embodiments, the p-type bias network 40 is configured to generate class A/B bias. An n-type bias network 42 is configured to generate bias for the n-type transistors Q4, Q5, and Q6. In some embodiments, the n-type bias network 42 is configured to generate class A/B bias. A first AM-PM compensator 44 is configured to substantially maintain constant output capacitance of at least the transistor Q2 of the p-type cascode transistors Q1, Q2, and Q3. In at least one embodiment, the first AM-PM compensator 44 includes a transistor Q7 configured as a varactor. In the exemplary embodiment depicted in FIG. 2B, a fixed compensating capacitor C3 can also be coupled across the transistor Q2 from source to drain. A second AM-PM compensator 46 is configured to substantially maintain constant output capacitance of at least the transistor Q5 of the n-type cascode transistors Q4, Q5, and Q6. In at least one embodiment, the second AM-PM compensator 46 includes a transistor Q8 configured as a varactor. In the exemplary embodiment depicted in FIG. 2A, a fixed compensating capacitor C4 can also be coupled across the transistor Q5 from source to drain. It is to be understood that additional AM-PM compensators structured substantially like the first AM-PM compensator 44 may added across any or all the remaining transistors Q1, Q3, Q4, and Q6 and any further top cascode that may be added in a high stack count amplifier. Other methods of AM-PM correction may be used for the top cascode devices, different from the parallel drain-source capacitance used for the lower cascode devices.

An exemplary embodiment of the compression compensating (CC) amplifier 14 is depicted in FIG. 2A. The CC amplifier 14 includes a p-type transistor Q9 is coupled in parallel with the transistor Q1 of the series stack of p-type transistors Q1, Q2, and Q3. A gate 20-1 of the transistor Q9 is coupled to the first RF input 16-1 by way a coupling capacitor C5. An n-type transistor Q10 is coupled in parallel with the transistor Q6 of the series stack of n-type transistors Q4, Q5, and Q6. A gate 20-2 of the transistor Q10 is coupled to the second RF input 16-2 by way of a coupling capacitor C6. The class-C bias network 32 has a first bias output 48 coupled to the gate 20-1 of the transistor Q9. The class-C bias network 32 is configured to generate a first class-C bias for the transistor Q9 through the first bias output 48. The class-C bias network 32 has a second bias output 50 coupled to the gate 20-2 of the transistor Q10. The class-C bias network 32 is configured to generate a second class-C bias for the transistor Q10 through the second bias output 50.

In the exemplary embodiment of FIG. 2A, an input AM-PM compensator 36A includes a transistor Q11A that is configured as a varactor. A resistor R1 and a first series voltage source V1 is coupled between the supply voltage VDD and a drain and a source of the transistor Q11A. The input AM-PM compensator 36A is configured to substantially maintain constant input capacitance of at least the transistor Q9.

Also, an input AM-PM compensator 36B includes a transistor Q11B that is configured as a varactor. A resistor R2 and a second series voltage source V2 is coupled between a fixed voltage node, which in this case is ground (GND1), and a drain and a source of the transistor Q11B. The input AM-PM compensator 36B is configured to substantially maintain constant input capacitance of at least the transistor Q10. It is to be understood that additional AM/PM compensators structured substantially like the input AM-PM compensators 36A and 36B may added to the inputs/gates of any or all the remaining transistors Q2, Q3, Q4, Q5, and Q9.

Figure 2B:
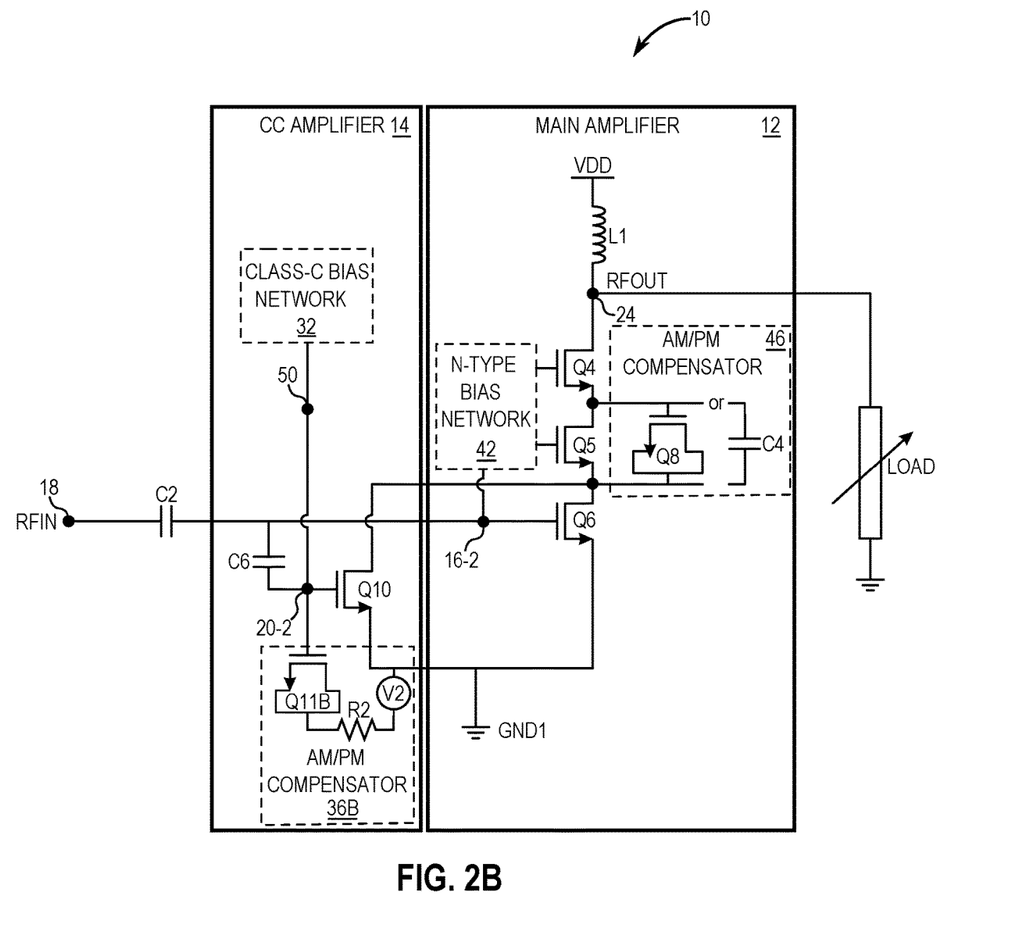
FIG. 2B is a detailed schematic of an exemplary embodiment of an n-type power amplifier system that is structured in accordance with the present disclosure.

FIG. 2B is a detailed schematic of an exemplary embodiment of the power amplifier system 10 that is structured in accordance with the present disclosure. The main amplifier 12 includes the series stack n-type transistors Q4, Q5, and Q6 coupled to an RF input 16-2, which in this embodiment is coupled to the supply voltage VDD through an inductor L1. The n-type bias network 42 is configured to generate bias for the n-type transistors Q4, Q5, and Q6. In some embodiments, the n-type bias network 42 is configured to generate class A/B bias. A first AM-PM compensator 46 is configured to substantially maintain constant output capacitance of at least the transistor Q5 of the n-type stacked amplifier. In at least one embodiment, the first AM-PM compensator 46 includes a transistor Q8 configured as a varactor. Using a varactor already gives a nonlinear capacitance that is larger when the drain-source voltage of the cascode Q5 is large and a small capacitance when the cascode Q4 is in triode region. In the exemplary embodiment depicted in FIG. 2B, a fixed compensating capacitor C4 can also be coupled across the transistor Q5 from source to drain. Although constant, the C4 capacitance will show a variable loading to the signal path when the cascode Q5 is in saturation and when it is in triode mode. It is to be understood that additional AM-PM compensators structured substantially like the first AM-PM compensator 46 may added across any or all the remaining transistors such as Q4 and Q6. Other methods of AM-PM correction may be used for the top cascode device Q4.

Figure 3:
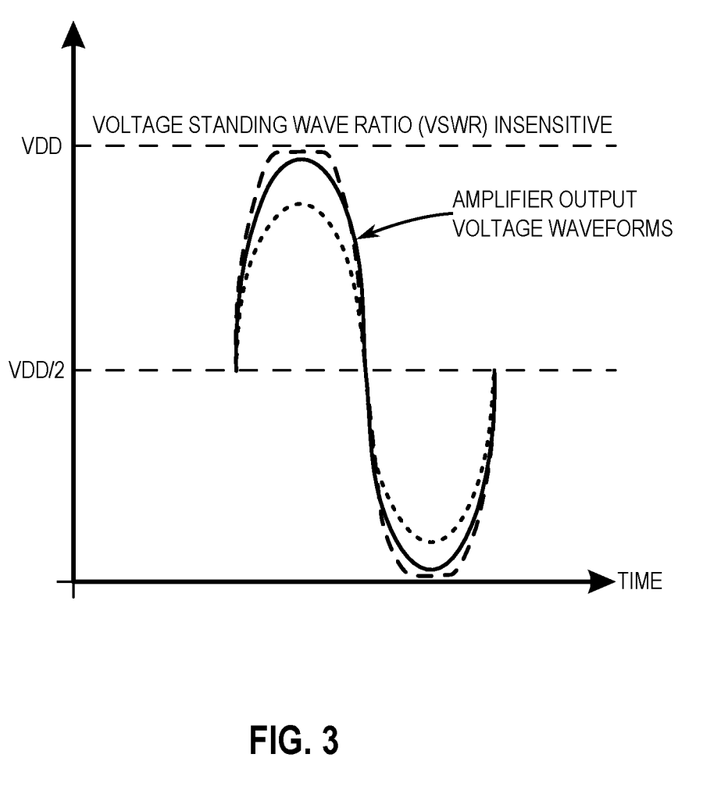
FIG. 3 is a graph of simulated output signal generated by the main amplifier showing an insensitivity to voltage standing wave ratio (VSWR) changes.

FIG. 3 is a graph of simulated output signal generated by the main amplifier showing an insensitivity to voltage standing wave ratio (VSWR) changes. The cascoded transistors of the series stack of p-type transistors Q1, Q2, and Q3 and series stack of n-type transistors Q4, Q5, and Q6 have an issue of giving large AM-PM distortion when the cascoded transistors enter a triode region when gate capacitance typically shows large effects within signal paths of the main amplifier 12. The AM-PM compensation ensures that the power amplifier system 10 meets the required AM-PM linearity for 5G applications.

Figure 4:
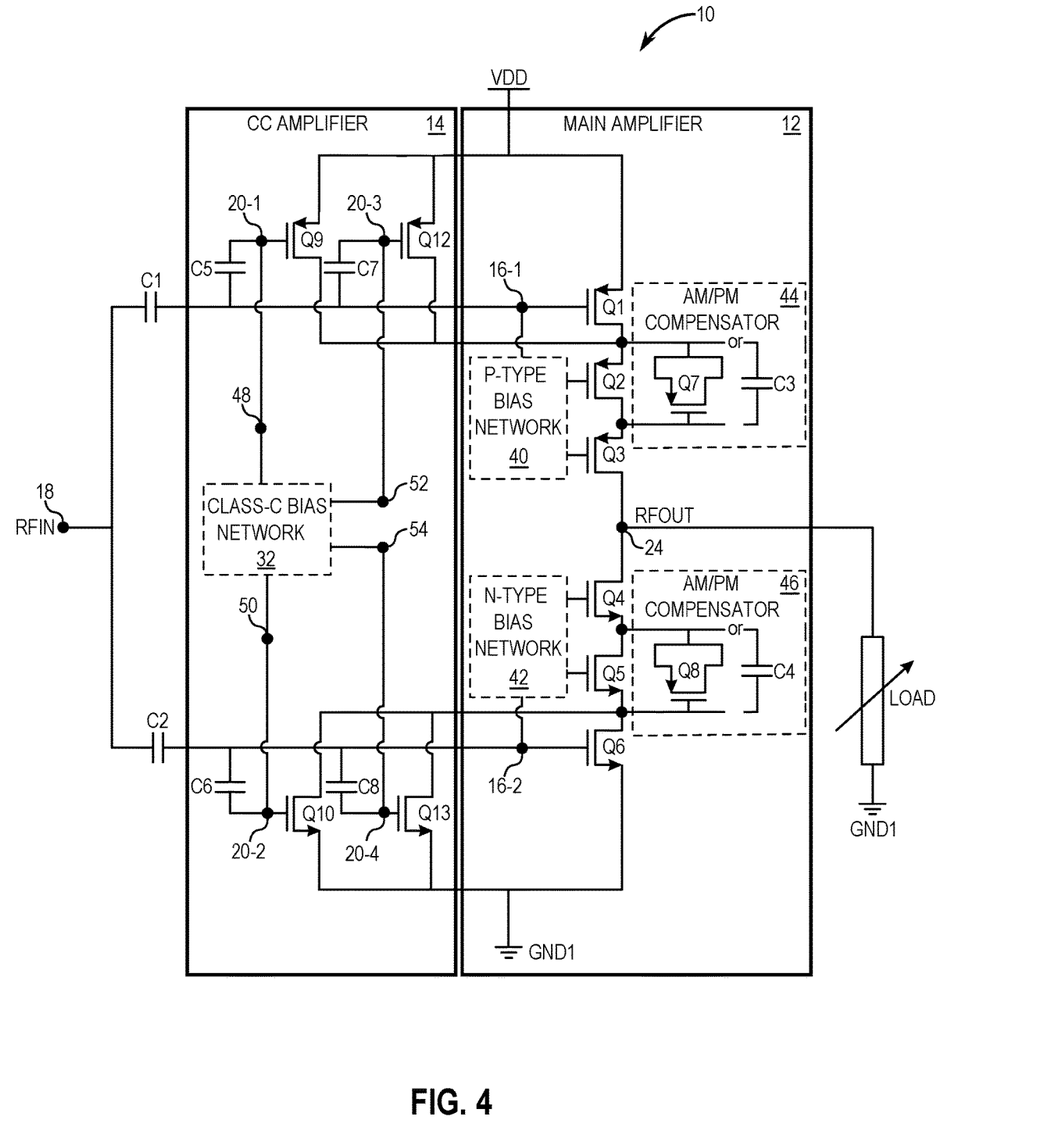
FIG. 4 is a detailed schematic of another exemplary embodiment of the power amplifier system that is structured in accordance with the present disclosure, having multiple AM-AM correction circuits connected in parallel to realize a multi-segment linearization

FIG. 4 is a detailed schematic of another exemplary embodiment of the power amplifier system 10 that is structured in accordance with the present disclosure. In this exemplary embodiment, the CC amplifier 14 is configured to provide additional amplification in a piecewise fashion. This is useful when the main amplifier 12 has a gain characteristic that shows distortions having different slopes. For example, at moderate signal level the main amplifier 12 may exhibit a soft compression, while at large signal the main amplifier 12 may exhibit a more pronounced compression. In this case, the CC amplifier 14 includes at least another p-type transistor Q12 that is coupled in parallel with the transistor Q1 of the series stack of p-type transistors Q1, Q2, and Q3. A gate 20-3 of the transistor Q12 is coupled to the first RF input 16-1 by way a coupling capacitor C7. At least another n-type transistor Q13 is coupled in parallel with the transistor Q6 of the series stack of n-type transistors Q4, Q5, and Q6. A gate 20-4 of the transistor Q13 is coupled to the second RF input 16-2 by way of a coupling capacitor C8. The class-C bias network 32 has a third bias output 52 that is coupled to the gate 20-3 of the transistor Q12. The class-C bias network 32 is configured to generate third class-C bias for the transistor Q12 through the third bias output 52. The class-C bias network 32 has a fourth bias output 54 that is coupled to the gate 20-4 of the transistor Q13. The class-C bias network 32 is configured to generate a fourth class-C bias for the transistor Q13 through the fourth bias output 54. For example, a first p-type bias and a second p-type bias are set at different levels and a first n-type bias and a second n-type bias are set at different levels to provide piecewise compensation of the AM-AM distortion generated due to soft compression experienced by the main amplifier 12. In alternate embodiments more than the two CC amplifiers 14A and 14B may be used to correct the AM-AM distortion of the main amplifier.

In this regard, a power amplifier may be comprised of one, two, three or even more amplifying stages. All stages or only a subset of the power amplifier stages may use the presented AM-AM and AM-PM correction circuits. In general, the front-end stages operate at lower signal level and thus exhibit more linear characteristics that may not require AM-AM and/or AM-PM linearization. It is the back-end stages (in particular, the last output stage) that operates at the largest signal level and thus exhibits a higher level of distortion, mandating the use of AM-AM and/or AM-PM correction circuits.

In some embodiments, the main amplifier 12 and the CC amplifier 14 are complementary metal oxide semiconductor (CMOS)-type amplifiers. In other embodiments, the main amplifier 12 and the CC amplifier 14 are partially depleted silicon-on-insulator (SOI) CMOS-type amplifiers. In yet other embodiments, the main amplifier 12 and the CC amplifier 14 are fully depleted SOI CMOS-type amplifiers.

Figure 5:
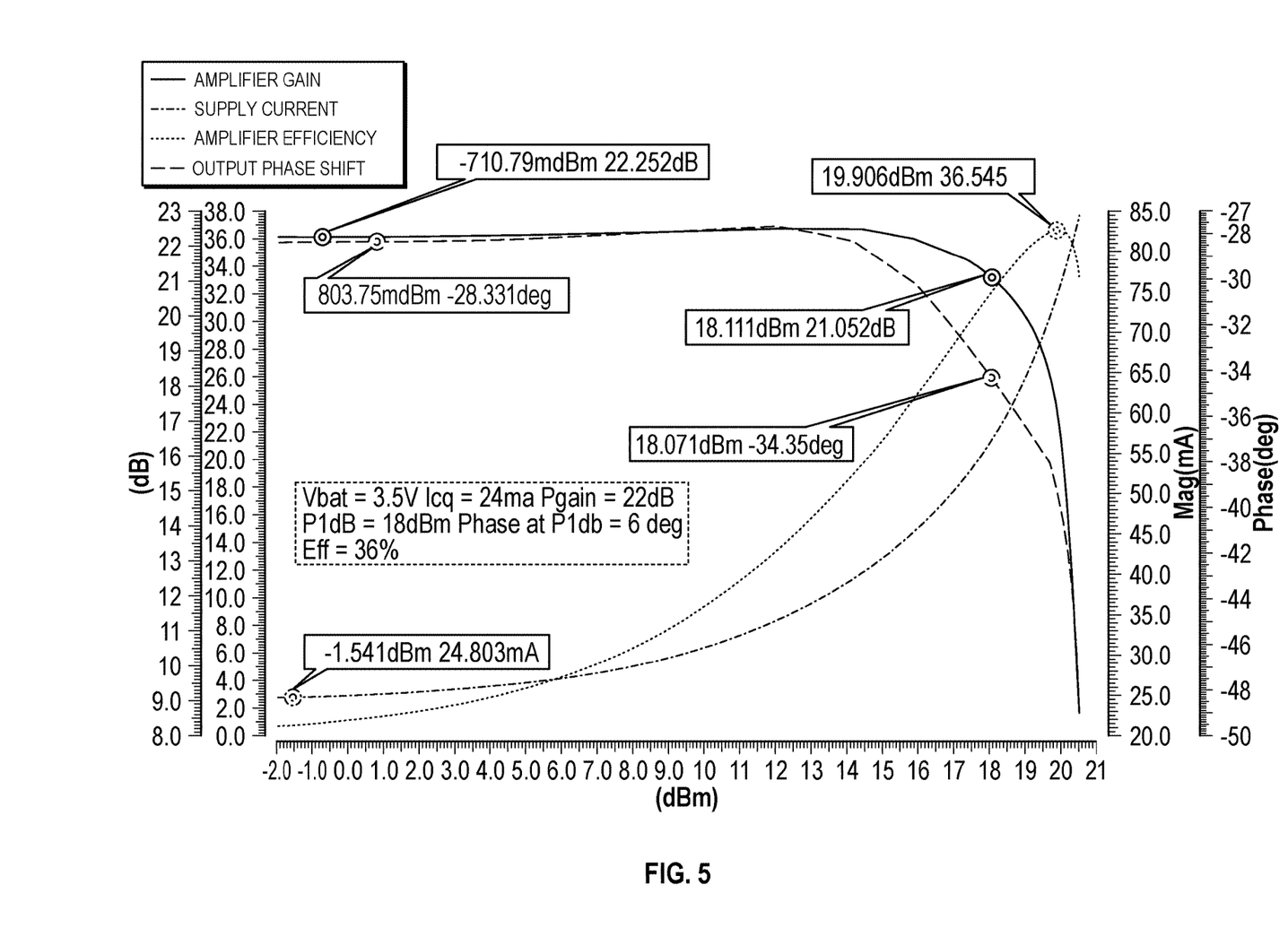
FIG. 5 is a graph of amplifier gain, supply current, amplifier efficiency, and output phase shift performance of the exemplary embodiment of FIG. 2B.

FIG. 5 is a graph of amplifier gain, supply current, amplifier efficiency, and output phase shift for the exemplary embodiment of the power amplifier system 10 depicted in FIG. 2. In particular, FIG. 5 shows improved performances of a millimeter wave complementary metal oxide semiconductor (CMOS) version of the power amplifier system 10 built in 22-nm fully depleted silicon-on-insulator process using a complementary cascode output stage that is the main amplifier 12. A high intrinsic AM-AM and AM-PM linearity is achieved, without using external digital predistortion linearization. Digital predistortion linearization can always be added on top to further improve the linearity performance of the main amplifier 12. Notice that for a battery voltage (Vbat) of 3.5 V the quiescent current (14 of the main amplifier 12 is in a 20 mA range, which is relatively highly desirable, while the peak current at a maximum power level remains below 100 mA. Also note that a relatively high efficiency of around 36% is also achieved in the power amplifier system 10.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier system comprising:
a main amplifier having a series stack of p-type transistors with a first signal input and a first signal output and a series stack of n-type transistors having a second signal input coupled to a common radio frequency, RF, input with the first signal input and a second signal output coupled to a common RF output with the first signal output, wherein the main amplifier exhibits a nonlinear gain characteristic with compression;
a compression compensating (CC) amplifier having a third signal input coupled to the common RF input and a third signal output coupled to the common RF output, the CC amplifier comprising:
a first p-type transistor coupled in parallel with one of the p-type transistors in the series stack of p-type transistors;
a first n-type transistor coupled in parallel with one of the n-type transistors in the series stack of n-type transistors; and
a class-C bias network having a first p-type bias output coupled to a gate of the first p-type transistor and a first n-type bias output coupled to a gate of the first n-type transistor, wherein the class-C bias network is configured to generate a first p-type class-C bias for the first p-type transistor, and the class-C bias network is further configured to generate a first n-type class-C bias for the first n-type transistor, wherein the first p-type class-C bias generated at the first p-type bias output and the first n-type class-C bias generated at the first n-type bias output are configured to generate an offset bias that aligns an activation of a class-C parallel amplifier with an inflection point of a compression in the main amplifier, wherein an additional gain provided by the compression compensating (CC) amplifier is configured to inversely match the compression of the main amplifier to compensate the compression of the main amplifier.

2. The power amplifier system of claim 1, wherein the CC amplifier further comprises an amplitude modulation-phase modulation (AM-PM) compensator configured to maintain substantially constant the input capacitance of the CC amplifier.

3. The power amplifier system of claim 1, wherein the compression compensating (CC) amplifier comprises:
a second p-type transistor coupled in parallel with the first p-type transistor; and a second n-type transistor coupled in parallel with the first n-type transistor, wherein the class-C bias network has a second p-type bias output coupled to a gate of the second p-type transistor and a second n-type bias output coupled to a gate of the second n-type transistor, wherein the class-C bias network is configured to generate a second p-type class-C bias for the second p-type transistor, and the class-C bias network is further configured to generate a second n-type class-C bias for the second n-type transistor.

4. The power amplifier system of claim 3, wherein the first p-type bias output and the second p-type bias output and first n-type bias output and the second n-type bias output are set at different levels to provide piecewise compensation of an amplitude modulation-amplitude modulation (AM-AM) distortion generated due to soft compression experienced by the main amplifier.

5. The power amplifier system of claim 3, wherein the first p-type bias output and the second p-type bias output are set at different levels and the first n-type bias output and the second p-type bias output are also set at different levels to provide piecewise compensation of an AM-AM distortion generated due to soft compression experienced by the main amplifier.

6. The power amplifier system of claim 5, wherein the stacked devices comprising n-type devices are replaceable by p-type devices or the stacked devices comprising p-type devices are replaceable by n-type devices.

7. The power amplifier system of claim 1, wherein the main amplifier and the CC amplifier are complementary metal oxide semiconductor (CMOS)-type amplifiers.

8. The power amplifier system of claim 7, wherein the main amplifier and the CC amplifier are partially depleted silicon-on-insulator (SOI) CMOS-type amplifiers.

9. The power amplifier system of claim 7, wherein the main amplifier and the CC amplifier are fully depleted SOI CMOS-type amplifiers.

10. The power amplifier system of claim 1, wherein the CC amplifier further includes an input AM-PM compensator configured to provide compensation for input capacitance of the CC amplifier.

11. The power amplifier system of claim 10, wherein the input AM-PM compensator is configured to provide a substantially constant input capacitance while the CC amplifier is actively compensating for AM-AM distortion generated by the main amplifier during soft compression.

12. The power amplifier system of claim 10, wherein the input AM-PM compensator comprises a field-effect transistor that is configured as a varactor having a bias network to set a threshold where its equivalent capacitance starts decreasing.

13. The power amplifier system of claim 12, wherein the input AM-PM compensator further includes a resistor coupled between a fixed voltage node and the field-effect transistor that is configured as a varactor, in order to set the threshold where its equivalent capacitance starts decreasing.

14. The power amplifier system of claim 1, further including an output AM-PM compensator realized with a fixed capacitance connected in parallel drain-to-source with a middle transistor in the n-type series stack of transistors, the p-type series stack of transistors, or a complementary-type of series stack of transistors.

15. The power amplifier system of claim 1, further including an output AM-PM compensator realized with a varactor capacitance connected in parallel drain-to-source with a middle transistor in the series stack of transistors (n-type, p-type or complementary-type) that presents a larger equivalent capacitance when the middle cascode device is in saturation operation and a smaller equivalent capacitance when the middle cascode device is in triode operation.

16. The power amplifier system of claim 1, wherein the main amplifier and the CC amplifier provide an efficiency between 25% and 45% over an output power range between −2.0 dBm and up to 25 dBm.

17. The power amplifier system of claim 16, wherein the main amplifier and the CC amplifier draw a peak current that is below 100 mA at a power level of up to 25 dBm.

* * * * *

UNITED STATES PATENT AND TRADEMARK OFFICE
CERTIFICATE OF CORRECTION

PATENT NO. : 12,483,204 B2  
APPLICATION NO. : 17/706985  
DATED : November 25, 2025  
INVENTOR(S) : Baker Scott et al.

Page 1 of 1

It is certified that error appears in the above-identified patent and that said Letters Patent is hereby corrected as shown below:

In the Specification

In Column 8, Line 3, replace "current (14 of" with --current (Icq) of--.

Signed and Sealed this  
Sixth Day of January, 2026

John A. Squires  
*Director of the United States Patent and Trademark Office*